United States Patent
Hur et al.

(10) Patent No.: US 10,812,049 B2
(45) Date of Patent: Oct. 20, 2020

(54) RECONFIGURABLE FEED-FORWARD FOR ELECTRICAL BALANCE DUPLEXERS (EBD)

(71) Applicant: Apple Inc., Cupertino, CA (US)

(72) Inventors: Joonhoi Hur, Sunnyvale, CA (US);
Rastislav Vazny, Sunnyvale, CA (US);
Ronald W. Dimpflmaier, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 121 days.

(21) Appl. No.: 16/123,826

(22) Filed: Sep. 6, 2018

(65) Prior Publication Data
US 2020/0083867 A1    Mar. 12, 2020

(51) Int. Cl.
| | | |
|---|---|---|
| H03H 9/72 | (2006.01) | |
| H03H 7/46 | (2006.01) | |
| H04L 5/14 | (2006.01) | |
| H04B 1/12 | (2006.01) | |
| H03H 9/145 | (2006.01) | |
| H03H 9/64 | (2006.01) | |

(Continued)

(52) U.S. Cl.
CPC .......... *H03H 9/725* (2013.01); *H03H 7/463* (2013.01); *H03H 9/14502* (2013.01); *H03H 9/6406* (2013.01); *H04B 1/123* (2013.01); *H04B 1/38* (2013.01); *H04B 1/52* (2013.01); *H04L 5/14* (2013.01)

(58) Field of Classification Search
CPC ........ H03H 7/463; H03H 7/465; H03H 7/466; H03H 7/468; H03H 7/482; H03H 7/485; H03H 7/487; H03H 9/14502; H03H 9/6406; H03H 9/706; H03H 9/725; H04B 1/12; H04B 1/123; H04B 1/38; H04B 1/40; H04B 1/401; H04B 1/44; H04B 1/48; H04B 1/50; H04B 1/52; H04B 1/586; H04L 5/14; H04L 5/16; H04L 5/22
USPC ........ 375/219, 220, 222, 257; 370/278, 282, 370/290, 291
See application file for complete search history.

(56) References Cited

U.S. PATENT DOCUMENTS

| | | | | |
|---|---|---|---|---|
| 5,566,260 A | * | 10/1996 | Laughlin | ................ G02B 6/352 385/16 |
| 7,468,638 B1 | * | 12/2008 | Tsai | .......................... H04B 1/48 331/126 |

(Continued)

OTHER PUBLICATIONS

Kun-Da Chu et al., "A Broadband and Deep-TX Self-Interference Cancellation Technique for Full-Duplex and Frequency-Domain-Duplex Transceiver Application," 2018 IEEE International Solid-State Circuits Conference, https://www.researchgate.net/publication/323724888; 4 pgs.

*Primary Examiner* — Young T Tse
(74) *Attorney, Agent, or Firm* — Fletcher Yoder PC

(57) ABSTRACT

Systems, methods, and devices for reducing insertion loss and/or swapping transmitter (TX) and receiver (RX) frequencies in an electrical balance duplexer (EBD) used in a transceiver device for frequency division duplexing (FDD) applications are provided. Feed-forward receiver path from the antenna to a low noise amplifier (LNA) and a feed-forward path from the antenna to a power amplifier (PA) of the EBD may be used for reducing insertion loss of the RX and TX signals. In some embodiments, switches may be used to selectively alter operational modes for varied levels of isolation and/or swapping of TX and RX frequencies.

14 Claims, 5 Drawing Sheets

(51) Int. Cl.
  *H04B 1/52* (2015.01)
  *H04B 1/38* (2015.01)

(56) References Cited

U.S. PATENT DOCUMENTS

| | | | |
|---|---|---|---|
| 8,368,481 B2 * | 2/2013 | Jin | H03H 7/42 |
| | | | 333/101 |
| 8,792,836 B2 * | 7/2014 | Mikhemar | H04B 1/0458 |
| | | | 455/78 |
| 8,843,082 B2 | 9/2014 | Dufrene | |
| 8,971,219 B2 * | 3/2015 | Choksi | H03H 7/09 |
| | | | 370/276 |
| 10,498,298 B1 * | 12/2019 | Wang | H03F 3/245 |
| 2005/0255812 A1 * | 11/2005 | Na | H04B 1/48 |
| | | | 455/78 |
| 2006/0035600 A1 * | 2/2006 | Lee | H04B 1/18 |
| | | | 455/78 |
| 2009/0289721 A1 * | 11/2009 | Rajendran | H03F 3/195 |
| | | | 330/301 |
| 2013/0149957 A1 * | 6/2013 | Desclos | H04B 7/15 |
| | | | 455/11.1 |
| 2016/0112078 A1 | 4/2016 | Ju et al. | |
| 2017/0041095 A1 | 2/2017 | Hwang et al. | |
| 2018/0226932 A1 * | 8/2018 | Beaudin | H04B 1/18 |
| 2019/0074862 A1 * | 3/2019 | Wang | H03F 3/189 |

* cited by examiner

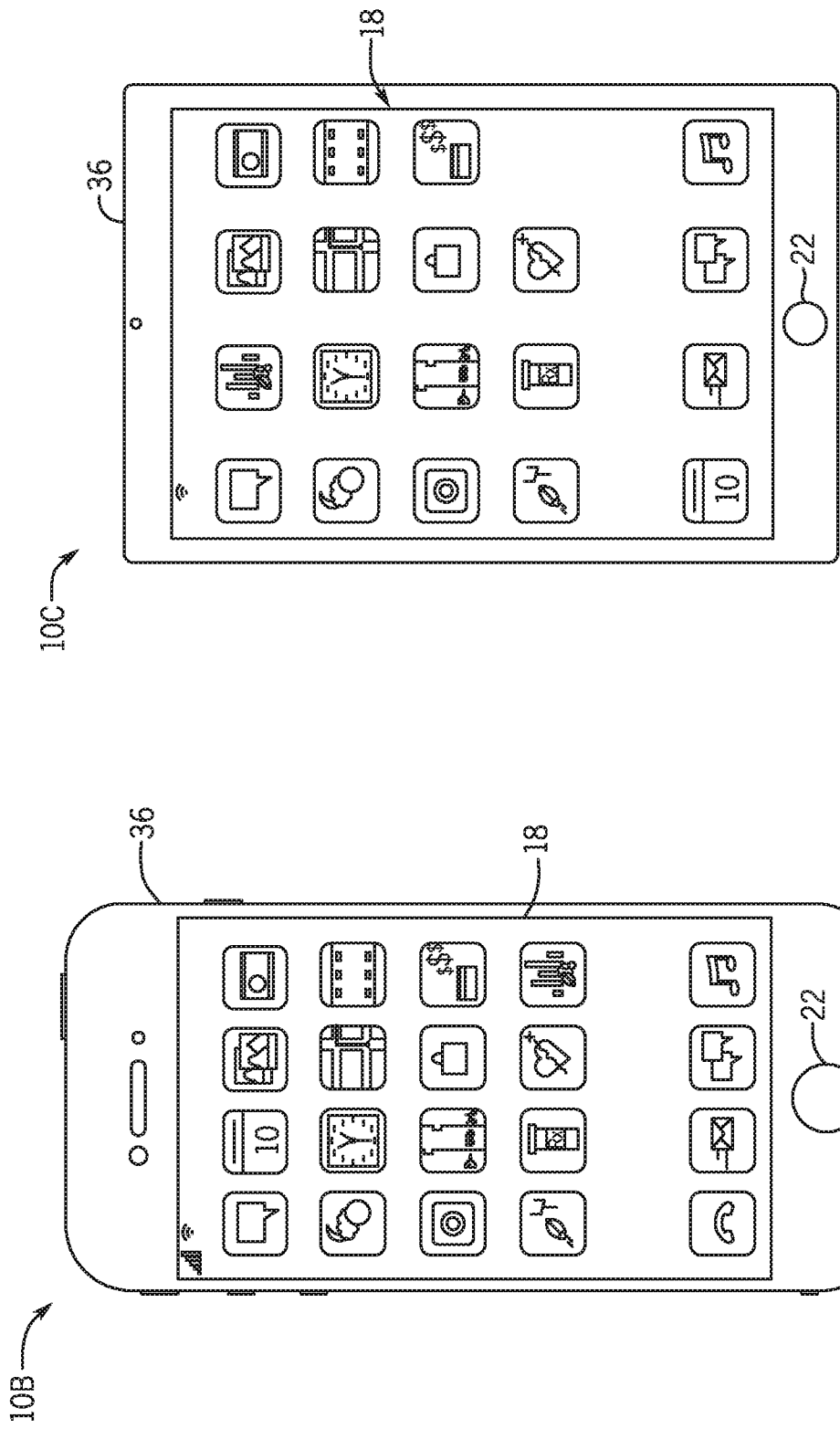

RECONFIGURABLE FEED-FORWARD FOR ELECTRICAL BALANCE DUPLEXERS (EBD)

BACKGROUND

The present disclosure relates generally to techniques for facilitating radio frequency (RF) communications, and more particularly, to transceivers utilizing an electrical balance duplexer (EBD).

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Transmitters and receivers, or when coupled together as part of a single unit, transceivers, are commonly included in various electronic devices, and particularly, portable electronic devices such as, for example, phones (e.g., mobile and cellular phones, cordless phones, personal assistance devices), computers (e.g., laptops, tablet computers), Internet connectivity routers (e.g., Wi-Fi routers or modems), radios, televisions, or any of various other stationary or handheld devices. Certain types of transceivers, such as full-duplex radio frequency (RF) transceivers, may generate and/or receive RF signals to be transmitted and/or received simultaneously by an antenna coupled to the transceiver, allowing for high speed data transmission. The RF transceiver is generally used to wirelessly communicate data over a network channel or other medium to one or more external wireless devices.

The receiver of the wireless device transceiver receives signals from the transmitter. The transmitter signals may be present at a small frequency distance from the receiving frequency band. Thus, transceivers require isolation between the transmitting and receiving paths to prevent signal interference or distortion. Bandpass filters and/or duplexers may be used to provide the necessary isolation.

Frequency selective filters, such as surface acoustic wave (SAW) filters may be used for wireless applications where a single antenna is shared between a transmitter and a receiver operating at close frequencies. SAW filters may be used for front-end filtering, narrow multiband filtering, and eliminating specific interference sources, and they can be narrow or wide, with band-pass, low-pass, and high-pass FIR characteristics. Alternatively, transceivers may utilize an electric balance duplexer, which may allow for bi-directional (e.g., duplex) communication over a single path and isolate the receiver from the transmitter while permitting them to share an antenna. Unfortunately, however, these isolation/filtering techniques may result in a signal insertion loss and/or may require increased area and monetary costs, as additional filters, etc. may be required.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Embodiments described herein are related to full-duplex transceivers of wireless devices that may transmit and receive signals simultaneously on different frequency bands (e.g., frequency division duplexing) of a wireless network. By way of example, an electrical balance duplexer (EBD) in a transceiver may enable simultaneous transmission and reception from a single antenna. Feed forward paths (e.g., electrically conductive paths) may be introduced into the electrical balance duplexer to enable the electrical balance duplexer enabling enhanced functionalities over traditional electrical balance duplexers. For example, using the feed-forward paths, the electrical balance duplexer may operate in an insertion loss reduction mode, which mitigates insertion loss typically experienced with traditional electrical balance duplexers. Further, by adjusting features of the same electrical balance duplexer circuit with feed forward paths, the electrical balance duplexer circuit may be adjusted to operate in a frequency swap mode that may swap transmitter and receiver frequencies. Additional adjustments may be made, such that the electrical balance duplexer circuit operates in a high isolation mode, where the components of the electrical balance duplexer are isolated to a greater extent despite potential increased insertion loss. Each of these modes may be selectively enabled via processing circuitry, enabling dynamic mode changes for different situations. To effectuate the different selectable modes, switches may be used to control particular feed forward pathways.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which:

FIG. 3 is a front view of a hand-held device representing another embodiment of the electronic device of FIG. 1, in accordance with an embodiment;

FIG. 4 is a front view of a hand-held tablet device representing another embodiment of the electronic device of FIG. 1, in accordance with an embodiment;

DETAILED DESCRIPTION OF SPECIFIC EMBODIMENTS

Figure 1:
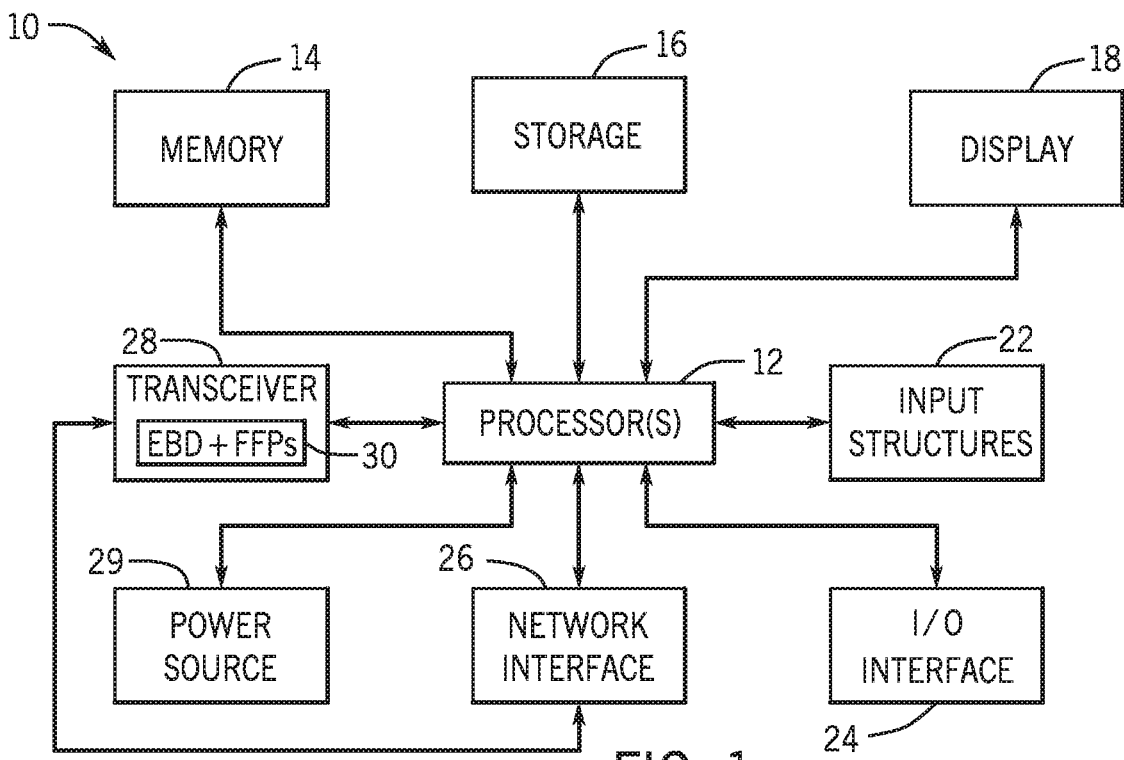
FIG. 1 is a schematic block diagram of an electronic device that may benefit from communicating with additional feed-forward paths in an electrical balance duplexer, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Radio communication systems use either time division duplexing (TDD) or frequency division duplexing (FDD) to enable the bi-directional communication in a transceiver, such that transmission and reception of signals are separated in either time or frequency. Frequency division duplexing requires one channel to transmit and one channel to receive. Time division duplexing transmits and receives data at alternating intervals. Wireless communication including Wi-Fi and Bluetooth typically use time division duplexing, while cellular communications, such as Long-Term Evolution (LTE), typically use frequency division duplexing. In frequency division duplexed radios, a transmitter and receiver in the RF transceiver may operate simultaneously and may use the same antenna, which may result in noise that may degrade signal-to-noise ratio (e.g., self-interference), especially at the receiver.

Since transmitter signals may be stronger than receiver signals, the transmitting and receiving paths in the transceiver may be isolated to prevent signal interference and distortion, especially when the receiver and transmitter are operating in close frequency (e.g., during FDD communications). Unfortunately, however, this isolation may result in insertion loss in the communicated signals. As discussed herein, utilizing an electrical balance duplexer (EBD) enhanced with feed-forward paths for a transmitting signal and/or a receiving signal in a transceiver may allow for effective isolation between the signals, while reducing insertion loss.

Conventional transceiver architecture for isolation may use frequency filters, including a surface acoustic wave (SAW) fixed-frequency filter per each transmitter and receiver frequency band supported by wireless communication. Since each frequency band requires a separate filter, a wireless device may include a variety of filters. The multiple filters may result in additional cost and circuitry area requirements, and thus, may lead to certain inefficiencies. Utilizing SAW filters may also result in insertion loss (e.g., loss of signal power), typically 3 dB for both the transmitter and receiver path. Electrical balance duplexers are an alternative to SAW filters in frequency division duplexing applications, achieving similar transmitter and receiver isolation and a lower insertion loss. In contrast to frequency based filters, such as SAW filters, an electrical balance duplexer may pass signals between the transmitter and antenna, and receiver and antenna, while simultaneously reducing self-interference from the transmitter, at the same frequency.

However, only limited isolation may be achieved using the electrical balance duplexer in a transceiver without insertion loss. Techniques used to achieve a higher isolation may result in higher loss of signal power or amount of signal removed from a signal path due to a circuit element (e.g., insertion loss), such that isolation may be achieved at the expense of insertion loss. To achieve high data rate transmissions, such as those used for cellular signals, the electrical balance duplexer may need sufficient broadband isolation, which may be achieved when its balancing network impedance equals the antenna impedance over a desired frequency band. To address these challenges, and improve the efficiency of transceiver architectures, wireless devices may operate in an insertion loss mode that may use feed-forward paths in an electrical balanced duplexer for routing signals to an amplifier based on the signal type (e.g., transmission or reception) to provide isolation of the signals while counter-acting insertion loss. In some embodiments, the electrical balance duplexer may be adjusted to operate in a frequency response swap mode based on an expected signal type on a given frequency, such that the transmitting and receiving frequencies may be swapped.

In some situations, high isolation may be desired. To provide higher isolation at the expense of losing signal power, as discussed above, tunable frequency filters that may be used in the receiver and transmitter feed-forward paths may be disconnected from the signal path in a high isolation mode. Disconnecting the filters may result in increased isolation by the electrical balance duplexer, despite introduction of insertion loss. As may be appreciated, this mode of operation may be selected when isolation is preferred over preventing insertion loss.

As discussed herein, in certain implementations, the selection of the different modes may be performed algorithmically based in part on compatibility to communicate with other devices in a wireless communication system or a pre-determined signal power threshold. For example, the operation mode may be determined after detecting an expected signal type on a given frequency band and/or signal power loss above or below a threshold. Subsequently, algorithms may be used to select an operation mode and send control signals to adjust the electrical balance duplexers depending on the selected operation mode.

With the foregoing in mind, a general description of suitable electronic device that may communicate via feed-forward and/or reconfigurable feed-forward electrical balance duplexers is provided below. Turning first to FIG. 1, an electronic device 10 according to an embodiment of the present disclosure may include, among other things, one or more processor(s) 12, memory 14, nonvolatile storage 16, a display 18, input structures 22, an input/output (I/O) interface 24, a network interface 26, and a power source 29. The various functional blocks shown in FIG. 1 may include hardware elements (including circuitry), software elements (including computer code stored on a computer-readable medium) or a combination of both hardware and software elements. It should be noted that FIG. 1 is merely one example of a particular implementation and is intended to illustrate the types of components that may be present in electronic device 10.

Figure 2:
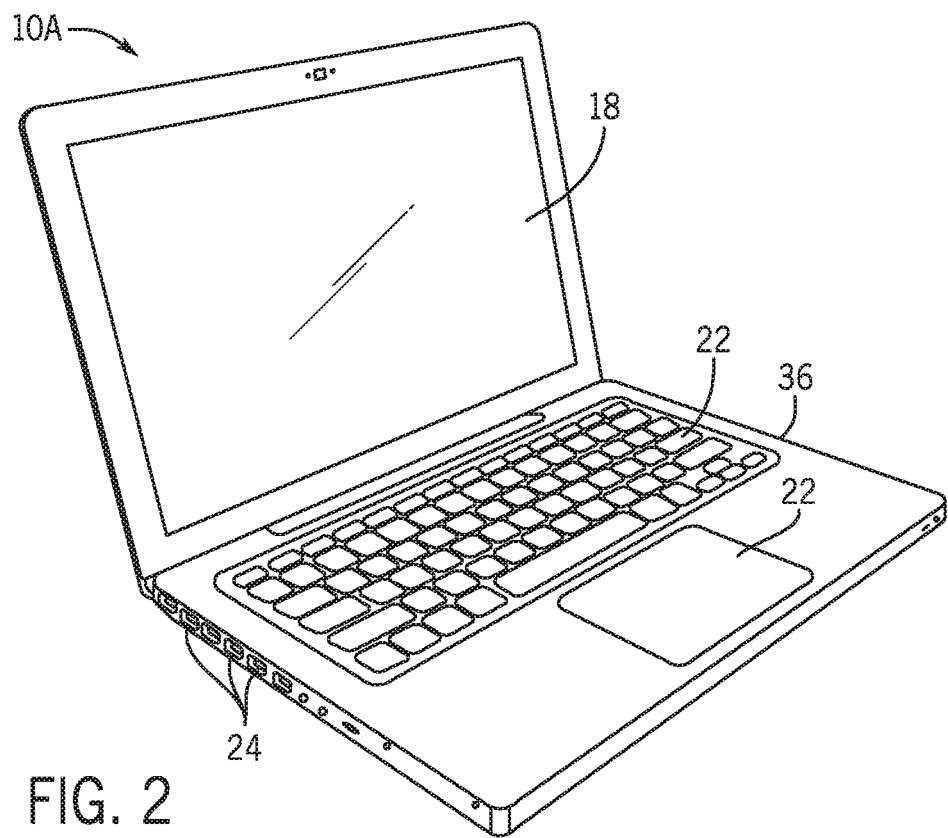
FIG. 2 is a perspective view of a notebook computer representing an embodiment of the electronic device of FIG. 1, in accordance with an embodiment.
Figure 5:
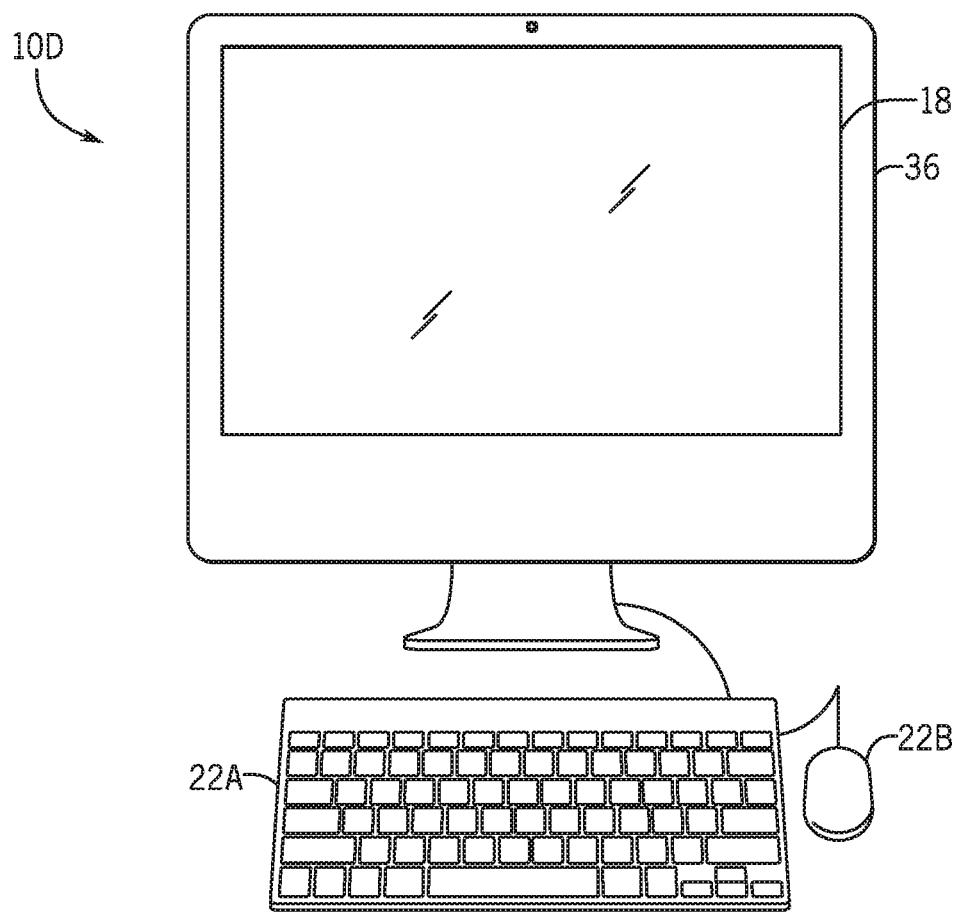
FIG. 5 is a front view of a desktop computer representing another embodiment of the electronic device of FIG. 1, in accordance with an embodiment.
Figure 6:
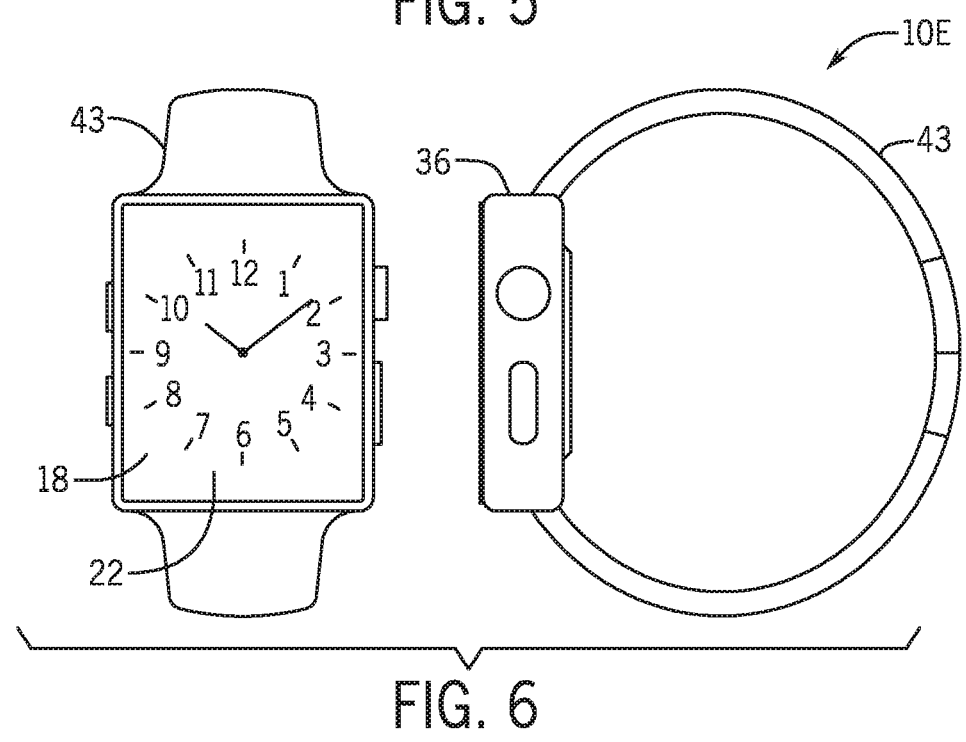
FIG. 6 is a front view and side view of a wearable electronic device representing another embodiment of the electronic device of FIG. 1, in accordance with an embodiment.

By way of example, the electronic device 10 may represent a block diagram of the notebook computer depicted in FIG. 2, the handheld device depicted in FIG. 3, the handheld device depicted in FIG. 4, the desktop computer depicted in FIG. 5, the wearable electronic device depicted in FIG. 6, or similar devices. It should be noted that the processor(s) 12 and other related items in FIG. 1 may be generally referred to herein as "data processing circuitry." Such data processing circuitry may be embodied wholly or in part as software, firmware, hardware, or any combination thereof. Furthermore, the data processing circuitry may be a single contained processing module or may be incorporated wholly or partially within any of the other elements within the electronic device 10.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26.

The network interface 26 may include, for example, one or more interfaces for a personal area network (PAN), such as a Bluetooth network, for a local area network (LAN) or wireless local area network (WLAN), such as an 802.11x Wi-Fi network, and/or for a wide area network (WAN), such as a 3rd generation (3G) cellular network, 4th generation (4G) cellular network, long term evolution (LTE) cellular network, long term evolution license assisted access (LTE-LAA) cellular network. The network interface 26 may also include one or more interfaces for, for example, broadband fixed wireless access networks (WiMAX), mobile broadband Wireless networks (mobile WiMAX), asynchronous digital subscriber lines (e.g., ADSL, VDSL), digital video broadcasting-terrestrial (DVB-T) and its extension DVB Handheld (DVB☐H), ultra-Wideband (UWB), alternating current (AC) power lines, and so forth.

In certain embodiments, to allow the electronic device 10 to communicate over the aforementioned wireless networks (e.g., Wi-Fi, WiMAX, mobile WiMAX, 4G, LTE, and so forth), the electronic device 10 may include a transceiver 28. The transceiver 28 may include any circuitry that may be useful in both wirelessly receiving and wirelessly transmitting signals (e.g., data signals). Indeed, in some embodiments, as will be further appreciated, the transceiver 28 may include a transmitter and a receiver combined into a single unit. For example, the transceiver 28 may transmit and receive OFDM signals (e.g., OFDM data symbols) to support data communication in wireless applications such as, but not limited, PAN networks (e.g., Bluetooth), WLAN networks (e.g., 802.11x Wi-Fi), WAN networks (e.g., 3G, 4G, and LTE and LTE-LAA cellular networks), WiMAX networks, and mobile WiMAX networks. As discussed herein, the transceiver 28 may make use of an enhanced electrical balance duplexer 30 that includes feed forward paths which may aid in isolation of transmitted and received signals, which reducing insertion loss.

As mentioned above, in some embodiments, the processor(s) 12 of the electronic device 10 of FIG. 1 may be operably coupled with the memory 14 and the nonvolatile storage 16 to facilitate the use of the processors(s) 12 to implement various stored algorithms. As discussed herein, the algorithms may include algorithms to control selection of operation modes (e.g., insertion loss mode, frequency response swap mode, or high isolation mode) as discussed in detail below. Such programs or instructions executed by the processor(s) 12 may be stored in any suitable article of manufacture that includes one or more tangible, computer-readable media at least collectively storing the instructions or routines, such as the memory 14 and the nonvolatile storage 16. Additionally and/or alternatively, the processor(s) 12 may receive an indication of a user-selected operation mode from, for example, the input structures 22. The processor(s) 12 may select the operation mode based upon this indication.

The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor(s) 12 to enable the electronic device 10 to provide various functionalities.

As further illustrated, the electronic device 10 may include a power source 29. The power source 29 may include any suitable source of power, such as a rechargeable lithium polymer (Li-poly) battery and/or an alternating current (AC) power converter.

In certain embodiments, the electronic device 10 may take the form of a computer, a portable electronic device, a wearable electronic device, or other type of electronic device. Such computers may include computers that are generally portable (such as laptop, notebook, and tablet computers) as well as computers that are generally used in one place (such as conventional desktop computers, workstations, and/or servers). In certain embodiments, the electronic device 10 in the form of a computer may be a model of a MacBook®, MacBook® Pro, MacBook Air®, iMac®, Mac® mini, or Mac Pro® available from Apple Inc. By way of example, the electronic device 10, taking the form of a notebook computer 10A, is illustrated in FIG. 2. The depicted computer 10A may include a housing or enclosure 36, a display 18, input structures 22, and ports of an I/O interface 24. In one embodiment, the input structures 22 (such as a keyboard and/or touchpad) may be used to interact with the computer 10A, such as to start, control, or operate a GUI or applications running on computer 10A. For example, a keyboard and/or touchpad may allow a user to navigate a user interface or application interface displayed on display 18.

FIG. 3 depicts a front view of a handheld device 10B, which represents one embodiment of the electronic device 10. The handheld device 10B may represent, for example, a portable phone, a media player, a personal data organizer, a handheld game platform, or any combination of such devices. By way of example, the handheld device 10B may be a model of an iPod® or iPhone® available from Apple Inc. of Cupertino, Calif. The handheld device 10B may include an enclosure 36 to protect interior components from physical damage and to shield them from electromagnetic interference. The enclosure 36 may surround the display 18. The I/O interfaces 24 may open through the enclosure 36 and may include, for example, an I/O port for a hardwired connection for charging and/or content manipulation using a standard connector and protocol, such as the Lightning connector provided by Apple Inc., a universal service bus (USB), or other similar connector and protocol.

User input structures 22, in combination with the display 18, may allow a user to control the handheld device 10B. For example, the input structures 22 may activate or deactivate the handheld device 10B, navigate user interface to a home screen, a user-configurable application screen, and/or activate a voice-recognition feature of the handheld device 10B. Other input structures 22 may provide volume control or may toggle between vibrate and ring modes. The input structures 22 may also include a microphone may obtain a user's voice for various voice-related features, and a speaker may enable audio playback and/or certain phone capabilities. The input structures 22 may also include a headphone input may provide a connection to external speakers and/or headphones.

FIG. 4 depicts a front view of a handheld tablet device 10C, which represents another embodiment of the electronic device 10. The handheld tablet device 10C may represent, for example, a tablet computer, or one of various portable computing devices. By way of example, the handheld device 10C may be a tablet-sized embodiment of the electronic device 10, which may be, for example, a model of an iPad® available from Apple Inc. of Cupertino, Calif. The handheld device 10C may also include an enclosure 36 that holds the electronic display 18. Input structures 22 may include, for example, a hardware or virtual home button.

Turning to FIG. 5, a computer 10D may represent another embodiment of the electronic device 10 of FIG. 1. The computer 10D may be any computer, such as a desktop computer, a server, or a notebook computer, but may also be a standalone media player or video gaming machine. By way of example, the computer 10D may be an iMac®, a MacBook®, or other similar device by Apple Inc. It should be noted that the computer 10D may also represent a personal computer (PC) by another manufacturer. A similar enclosure 36 may be provided to protect and enclose internal components of the computer 10D such as the display 18. In certain embodiments, a user of the computer 10D may interact with the computer 10D using various peripheral input devices, such as the keyboard 22A or mouse 22B (e.g., input structures 22), which may connect to the computer 10D.

Similarly, FIG. 6 depicts a wearable electronic device 10E representing another embodiment of the electronic device 10 of FIG. 1 that may be operate using the techniques described herein. By way of example, the wearable electronic device 10E, which may include a wristband 43, may be an Apple Watch® by Apple, Inc. More generally, the wearable electronic device 10E may be any wearable electronic device such as, for example, a wearable exercise monitoring device (e.g., pedometer, accelerometer, heart rate monitor), or other device by another manufacturer. The display 18 of the wearable electronic device 10E may include a touch screen display 18 (e.g., LCD, OLED display, active-matrix organic light emitting diode (AMOLED) display, and so forth), as well as input structures 22, which may allow users to interact with a user interface of the wearable electronic device 10E.

Electronic devices 10A, 10B, 10C, 10D, and 10E described above may all utilize transceivers with electrical balance duplexers that include feed-forward paths to reduce insertion loss. In some embodiments, switches may be added to the feed-forward paths to enable selectable modes of operation, which may be modified based upon particular desired attributes of electronic communications of the transceivers.

Figure 7:
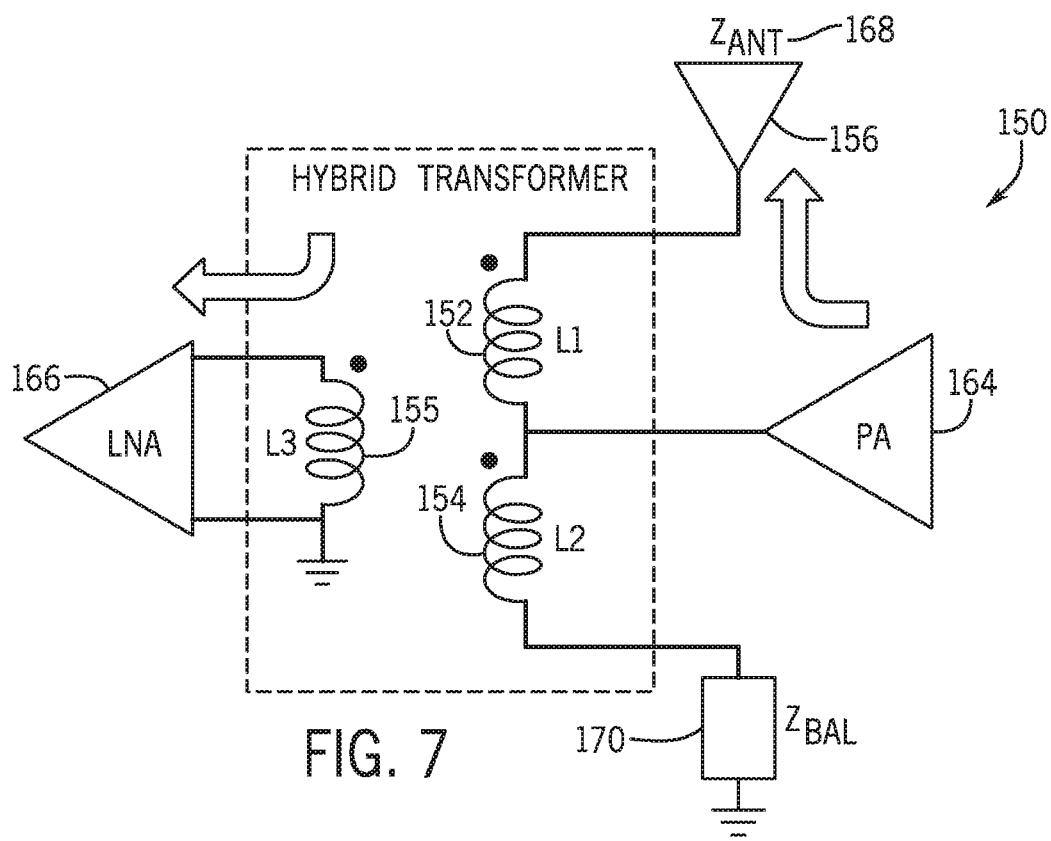
FIG. 7 is a schematic diagram of an electrical balance duplexer used with in a transceiver of the electronic device of FIG. 1, in accordance with an embodiment.

Turning now to a more detailed discussion of electrical balance duplexers that may be used as one of the technologies for isolating transmitter and receiver paths, block diagram of FIG. 7 depicts an electrical balance duplexer circuit 150 used in a wireless transceiver. As shown, the electrical balance duplexer circuit 150 may be implemented with a hybrid transformer, formed by a first inductor (L1) 152 and second inductor (L2) 154, coupled to an antenna 156. This portion of the hybrid transformer may make up a transmitter (TX) port. A third inductor (L3) 155 may be magnetically coupled to the first and second inductors 152 and 154 of the hybrid transformer, and this portion of the hybrid transformer may make up a receiver (RX) port. The transmitter path may utilize a power amplifier (PA) 164 to amplify signals when transmitting signals. The PA 164 may be connected to the first and second inductors 152 and 154. Further, the receiver path may utilize a low noise amplifier (LNA) 166 to amplify signals when receiving signals. The LNA 166 may be connected to the third inductor 155. The power amplifier 164 is the primary circuit element used in transmitting a signal while the low noise amplifier 166 is the primary circuit used in receiving a signal. The hybrid transformer may connect the transmitter and receiver to the antenna while maintaining high isolation between the power amplifier 164 and low noise amplifier 166.

The hybrid transformer is a fundamental aspect of the electric balance duplexer circuit 150. The hybrid transformer may be used to isolate the transmitter and receiver ports and high isolation between the ports may be achieved when balancing impedance, ZBAL 170, as equal to or close to antenna impedance, ZANT 168, such that that signal transmission is optimized. Thus, by controlling the balancing impedance 170 to be the same or similar to the antenna impedance 168, higher isolation at the transmitter path and receiver path and reduced insertion loss may be obtained. However, determining exact impedance at the antenna 156 may depend on the entire composition of the coupling structure. The potential antenna 156 impedance may also vary due to an electromagnetic environment or wireless device interactions, and thus, is difficult to determine. Instead, feed-forward techniques may be utilized to obtain the reduction in insertion loss of signals of the concurrent transmission and reception paths.

Figure 8:
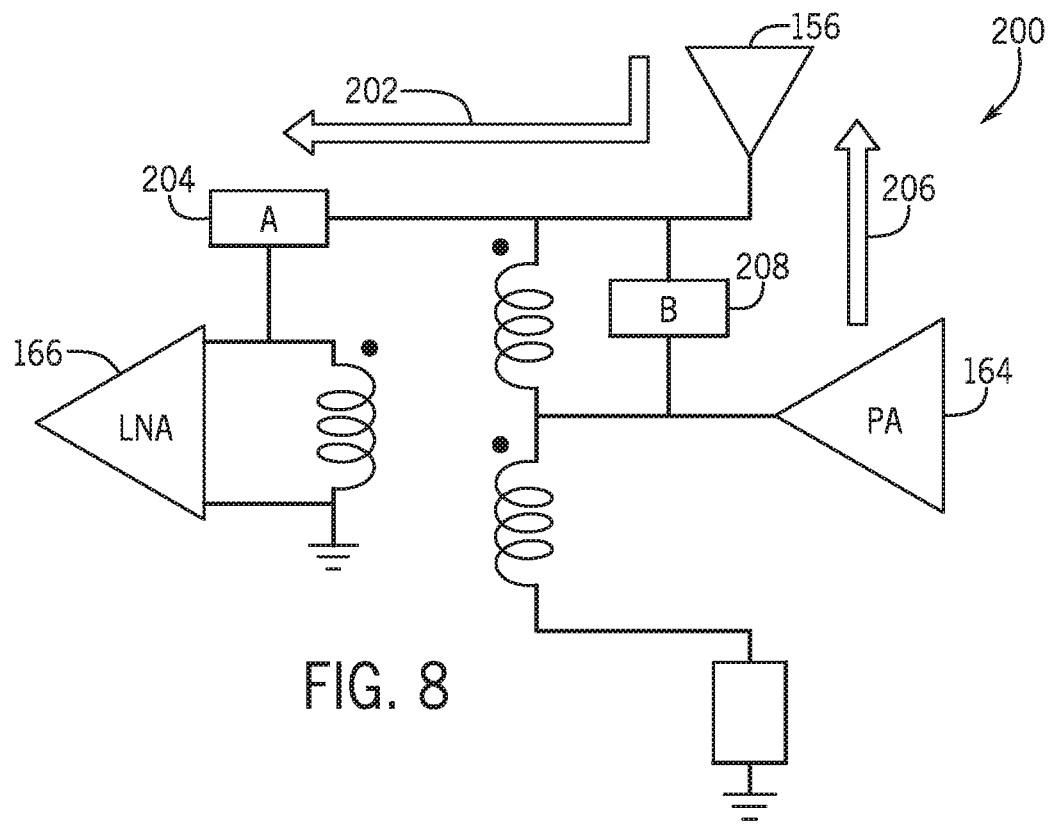
FIG. 8 is a schematic diagram of the electrical balance duplexer of FIG. 7 enhanced with additional feed-forward paths, in accordance with an embodiment.

To illustrate, block diagram in FIG. 8 depicts an enhanced electrical balance duplexer 200 with feed-forward transmitter and receiver paths, which may be utilized to achieve lower insertion loss while maintaining isolation between the two concurrently used signal paths. As shown, a feed-forward receiver path 202 from the antenna 156 to the low noise amplifier 166 and a feed-forward transmitter path 206 from the power amplifier 164 to the antenna 156 may be additional paths implemented to minimize insertion loss caused by the concurrent transmission and reception of wireless signals by only using the designated paths. The feed-forward receiver path 202 passes the signal from antenna 156 to the low noise amplifier 166. In this manner, the received signal power is not lost over the various components of the enhanced electrical balance duplexer 200. The feed-forward receiver path 202 may pass a received signal through filter A 204 before it is received at the low noise amplifier 166. The frequency response of filter A 204 may vary based on tuning circuit components (e.g., resistors, capacitors, inductors).

Similarly, feed-forward transmitter path 206 may pass a transmitting signal from power amplifier 164 to the antenna 156 to transmit the signal without signal loss, which may otherwise occur via components of an electrical balance duplexer 200. The feed-forward transmitter path 206 may pass the transmitting signal from the power amplifier 164 through filter B 208 before it is received at the antenna. As such, the amplified transmitting signal may be filtered for an appropriate frequency band prior to the antenna 156 transmitting it. The frequency response of filter B 208 may vary based on tuning circuit components (e.g., resistors, capacitors, inductors). For example, the frequency response of Filter B 208 may result in a high impedance at the receiver frequency and a low impedance at the transceiver frequency for a transmitting signal. Additionally, both filters A and B 204, 208 may be tunable filters, such that they may operate for multiple frequency bands by tuning to any of the cellular and Wi-Fi bands of a radio frequency spectrum.

As previously mentioned, most transceivers utilizing other isolation techniques, such as SAW filters, result in an insertion loss of 3 dB for both the transmitter and receiver signals. The feed-forward techniques described herein may reduce the insertion loss significantly. For example, in some embodiments the insertion loss may be reduced to approximately 1 dB.

In addition to isolating the transmitter and receiver paths to minimize insertion loss via feed-forward paths, which may enhance device-to-device communication, a series of switches may be used to customize operating modes of the enhanced electrical balance duplexer 200. For example, selected modes of operation could be used to swap the receiver frequency and transmitter frequency, and/or provide additional isolation between the transmitter and receiver paths, despite increased insertion loss.

Figure 9:
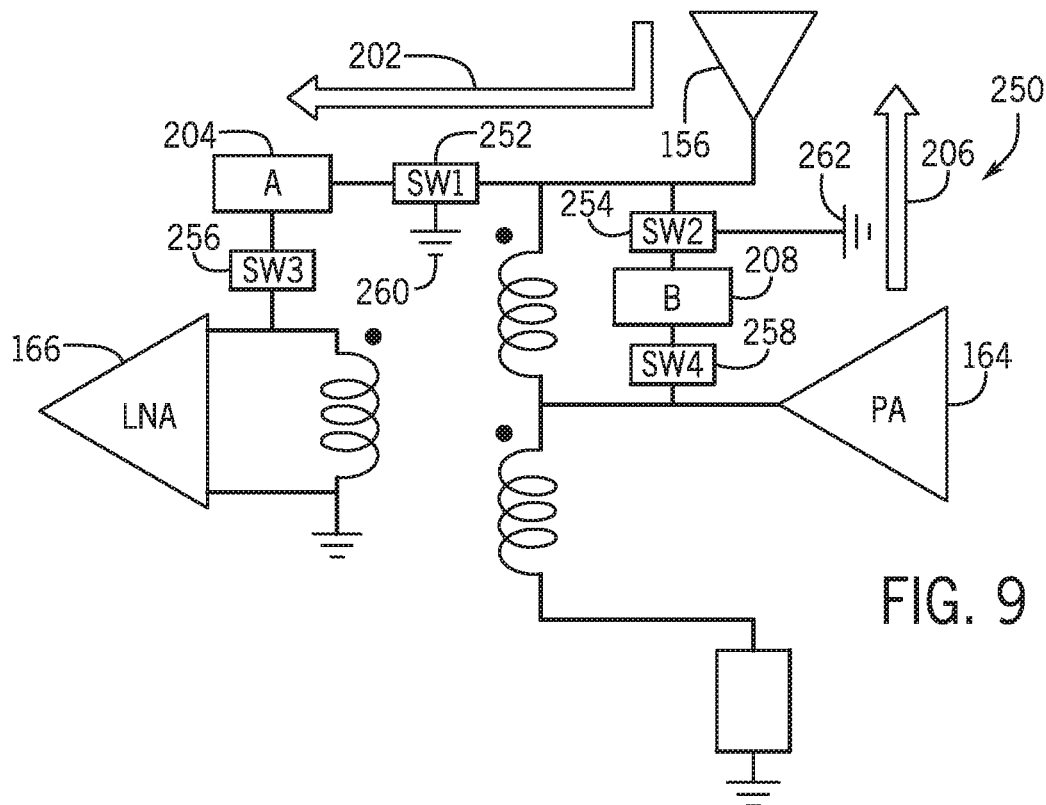
FIG. 9 is a schematic diagram of a reconfigurable feed-forward electrical balance duplexer of FIG. 8, in accordance with an embodiment.

To illustrate, block diagram of FIG. 9 shows a multi-mode electrical balance duplexer 250. The multi-mode electrical balance duplexer 250 includes multiple switches which may be selectively enabled to utilize different modes of operation of the multi-mode electrical balance duplexer 250. For example, certain switches may be selectively enabled to: isolate transmission and reception signals while mitigating insertion loss, swap transmitter and receiver frequencies, or to provide high isolation without mitigating for insertion loss.

As mentioned above, in some embodiments, it may be desirable to isolate transmission signals from reception signals, as these signals may cause interference with one another. Electrical balance duplexers enable such functionality, but with an insertion loss for the isolated signals. Using the selectable switches, a level of insertion loss mitigation may be specified, such that in some situations, when high isolation is desired, this may be done at a cost of insertion loss. In other situations, when only moderate isolation is desired, insertion loss mitigation may be employed, but at a cost of a magnitude of isolation of the transmission and reception signals.

Further, various devices in a wireless communication system may be expecting a signal transmitted from the electronic device 10 at a certain frequency, but the electronic device 10 may instead be receiving signals at the specified frequency band. Thus, the same electronic device 10 may need to swap transmitter and receiver frequencies to allow for compatible communication between the various devices. As shown, switches may be selectively coupled to ground, or the transceiver or receiver path, to disconnect or connect to the antenna 156 in order to swap transmission and reception frequency bands.

For example, the transmitter and receiver frequency response may be swapped or switched via a first switch 252 (SW1) and a second switch 254 (SW2), by coupling the switches 252, 254 to ground 260, 262. To swap frequencies responses, the first switch 252 (SW1) and the second switch 254 (SW2) may be connected to ground 260, 262, and thus, filter A 204 may still be utilized for filtering a signal prior to amplification by the low noise amplifier 166 but may not be coupled to the antenna 156. In a similar manner, filter B 208 in the transmitter path may be utilized to filter signals to be amplified by the power amplifier 166 and transmitted but may not be directly coupled to the antenna 156. By selectively decoupling the first switch 252 connecting the feed-forward receiver path to the antenna 156 and the second switch 254 connecting the feed-forward transmitter path to the antenna 156, and coupling to ground 260, 262, the frequency for transmitting and receiving may be swapped.

A series of switches may also be used to provide high isolation to the feed-forward electrical balance duplexer of FIG. 9. A third switch 256 (SW3) and a fourth switch 258 (SW4) may be selectively coupled to the feed-forward transmitter path 206, feed-forward receiver path 202, or disconnected (e.g., open) to operate in a high isolation mode, which may provide isolation to the transmitter and receiver but trade off insertion loss that may otherwise be provided by the feed-forward paths 202, 206. Isolation to the receiver port may be enhanced when the third switch 256 is open, disconnecting the feed-forward receiver path 202 with filter A 204 connected to the antenna 156, and when the fourth switch 258 is open, disconnecting the feed-forward transmitter path 206 with filter B 208 connected to the antenna 156. In this manner, if isolation is desired over insertion loss for either the transmitter path or receiver path, then the third switch 256 or fourth switch 258, or both, may be open to disconnect the feed-forward paths 202, 206 and allowing the amplifier of the reconfigurable electrical balance duplexer to operate similarly as they would in the electrical balance duplexer 150 of FIG. 7.

Thus, to operate in an insertion loss mitigation mode, each of the switches 252, 254, 256, and 256 may be closed (bypass), causing operation like the electrical balance duplexer 200 of FIG. 8. In this mode, filter A 204 is low impedance at the transmission frequency and high impedance at the reception frequency, and filter B 208 is low impedance at transmission frequency and high impedance at reception frequency. In contrast, for high isolation mode, each switch 252, 254, 256, 258 in the reconfigurable feed-forward electrical balance duplexer may be open, disconnecting the low noise amplifier 166, power amplifier 164, and antenna 156 from the feed-forward paths with filter A 204 and filter B 208. When all the switches are open, the circuit operates as a an electrical balance duplexer, as described in FIG. 7. The electrical balance duplexer may maximize isolation, but as previously described, may result in insertion loss of transmitted or received signals.

High isolation mode may be beneficial when the transmitter and receiver signals need to be isolated for proper wireless communication. As previously discussed, transmitter signals may generally be stronger than received signals and may interfere or distort the weaker receiver signals. Accordingly, high isolation mode may be even more beneficial when the transmitter transmits a signal at the highest power supported by the electronic device 10 while the receiver receives the weakest signal that may be communicated and supported by the electronic device 10.

Figure 10:
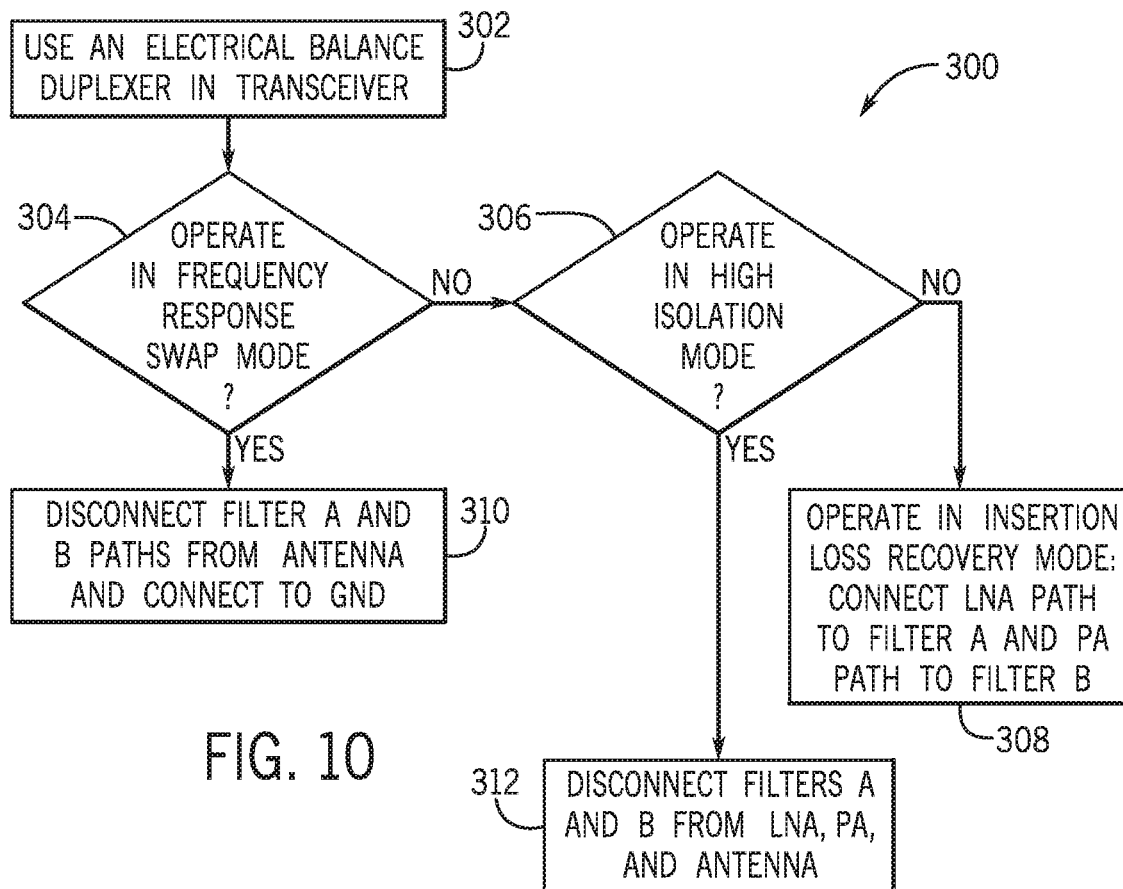
FIG. 10 is a flow diagram, illustrating a process for selectively enabling different modes of operation of the reconfigurable feed-forward electrical balance duplexer, in accordance with an embodiment.

To summarize, isolating the transmitter and receiver while minimizing insertion loss by feed-forward paths, swapping frequencies, and/or maximizing isolation by selectively disconnecting the feed-forward paths may be done via controlling selectable switches of the electrical balance duplexer 250. FIG. 10 illustrates one embodiment of a process 300 for a machine-executable algorithm that may reconfigure the multi-mode electrical balance duplexer to operate in the different modes. As shown, the electrical balance duplexer may be used in the wireless transceiver to provide isolation between the concurrent transmission and reception of signals (block 302). The transmitter and receiver of the electronic device 10 may be operating at specific wireless frequencies for transmission and reception that may be desired to be swapped. For example, the current transmission and reception frequencies may be incompatible with another device. Based on these factors (or other factors), the machine-executable algorithm of the electronic device 10 may check if the device should operate (decision block 304) in frequency swap mode for compatible wireless communication with another device. If frequency response swap is the appropriate mode of compatible communication, then the feed-forward electrical balance duplexer may be reconfigured by disconnecting (block 310) filter A of the receiver feed-forward path from the antenna by coupling the switch to ground, and disconnecting filter B of the transmission feed-forward path from the antenna by coupling the switch to ground. For example, referring back to FIG. 9, switches 252 and 254 may be opened to ground. The filters in the feed-forward transmitter or receiver path may be connected to the respective amplifier (e.g., low noise amplifier or power amplifier), disconnected from the direct paths to the antenna, and allow for frequency swapping.

On the other hand, if a frequency swap is not necessary, the machine-executable algorithm of the electronic device 10 may then check if the device may operate (decision block 306) in high isolation mode for compatible communication where there is no insertion loss mitigation. If a high isolation mode is the appropriate mode of compatible communication, then the feed-forward electrical balance duplexer may be reconfigured by disconnecting (block 312) the switch for connecting filter A to the antenna by connecting the switch to ground, disconnecting the switch for connecting filter A to the low noise amplifier, disconnecting the switch for connecting filter B to the antenna by connecting the switch to ground, disconnecting the switch for connecting filter B to the power amplifier, and effectively disconnecting the feed-forward receiver and transmitter paths from the antenna. In this configuration, the feed-forward electrical balance duplexer may function similar to the electrical balance duplexer 150 of FIG. 7, which may isolate the transceiver and receiver but result in insertion loss. Referring back to FIG. 9, switches 252, 254, 256, and 258 may all be opened, such that filters 204 and 208 are not reached by the components of the electrical balance duplexer 250.

As previously discussed, high isolation mode may be useful when the electronic device 10 transmits a signal at the highest power for a device while the receiver receives the weakest signal, but may also be based on a signal power threshold, such as switching to high isolation mode when a power signal reaches or passes a pre-determined signal power level. For example, transmission power may be at its highest when a wireless base station is located far from the electronic device 10, and thus, the electronic device 10 may operate in high isolation mode. The electronic device 10 may be include machine processing algorithms to determine (e.g., based on a frequency response threshold) if and when to swap frequency or to operate in a high isolation mode. The threshold for a swapping frequencies mode may be a minimum frequency response or a substantial change in frequency response for either the transmitter and/or receiver. The threshold for swapping frequencies or high isolation mode may be pre-determined via an algorithm of a design software used to configure the electronic device 10.

If the machine-executable algorithm of the electronic device 10 determines not to operate in high isolation mode, but instead a moderate isolation mode with insertion loss mitigation, then the electrical balance duplexer may be set to operate (block 308) in an insertion loss recovery mode via the feed-forward paths, as described in FIG. 8, such that the low noise amplifier is connected to filter A and the antenna in the direct feed-forward receiver path, and the power amplifier is connected to filter B and the antenna in the direct feed-forward transmitter path. Thus, referring back to FIG. 9, switches 252, 254, 256, and 258 are all closed (e.g., away from GND) to complete the respective feed-forward paths.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. An electronic device comprising:
    a transceiver configured to receive and transmit communications signals in duplex, the transceiver comprising:
    an antenna;
    a low noise amplifier for amplification of received signals from the antenna;
    a power amplifier for amplification of transmission signals to the antenna; and
    an electrical balance duplexer for isolating the received signals from simultaneously transmitted transmission signals, wherein the electrical balance duplexer comprises a plurality of switches that are selectively enabled to perform different operational modes of the electrical balance duplexer, wherein the electrical balance duplexer further comprises:
    a feed-forward receiver path connecting the antenna to the low noise amplifier;
    a feed-forward transmitter path connecting the power amplifier to the antenna, wherein the feed-forward receiver path and the feed-forward transmitter path mitigate insertion loss caused by isolation functionality of the electrical balance duplexer; and
    a receiver frequency filter and a transmitter frequency filter, wherein the plurality of switches comprise:
    a first switch on the feed-forward receiver path, selectively coupling to ground or coupling the antenna to the receiver frequency filter;

a second switch on the feed-forward transmitter path, selectively coupling to ground or coupling the transmitter frequency filter to the antenna;
a third switch on the feed-forward receiver path, selectively coupling the receiver frequency filter to the low noise amplifier; and
a fourth switch on the feed-forward transmitter path, selectively coupling the power amplifier to the transmitter frequency filter.

2. The electronic device of claim 1, wherein one of the different operational modes comprises a frequency swap mode that swap a transmitter frequency response and a receiver frequency response by coupling the first switch and the second switch to ground, while maintaining a connection between the low noise amplifier and the receiver frequency filter via the third switch and maintaining a connection between the power amplifier and the transmitter frequency filter via the fourth switch.

3. The electronic device of claim 1, wherein one of the different operational modes comprises a high isolation mode that disables use of the feed-forward receiver path and the feed-forward transmitter path by opening the first switch, the second switch, the third switch, and the fourth switch.

4. The electronic device of claim 1, wherein one of the different operational modes comprises a moderate mitigation mode that selectively enables use of at least one of the transmitter frequency filter and the receiver frequency filter via the feed-forward transmitter path or the feed-forward receiver path, respectively.

5. The electronic device of claim 4, wherein additional isolation is provided to the low noise amplifier when the third switch is disconnected from the receiver frequency filter that connects to the feed-forward receiver path.

6. The electronic device of claim 4, wherein additional isolation is provided to the power amplifier when the fourth switch is disconnected from the transmitter frequency filter that connects to the feed-forward transmitter path.

7. The electronic device of claim 1, wherein the transmitter frequency filter and the receiver frequency filter are tunable to operate in multiple frequency bands.

8. The electronic device of claim 1, wherein the insertion loss is reduced to approximately 1 dB using the feed-forward receiver path and the feed-forward transmitter path in the electrical balance duplexer.

9. A method for isolating received signals from simultaneously transmitted transmission signals in an electronic device comprising a transceiver using an electrical balance duplexer, the method comprising:
receiving and transmitting communications signals in duplex on an antenna of the electrical balance duplexer in duplex;
amplifying received signals from the antenna using a low noise amplifier;
amplifying transmission signals to the antenna using a power amplifier;
isolating the received communication signals from the simultaneously transmitted transmission signals while mitigating insertion loss using the electrical balance duplexer; and
performing different operational modes on the electrical balance duplexer by selectively enabling a plurality of switches of the electrical balance duplexer, wherein the electrical balance duplexer comprises:
a feed-forward receiver path that connects the antenna to the low noise amplifier and a feed-forward transmitter path that connects the power amplifier to the antenna; and a receiver frequency filter and a transmitter frequency filter, wherein the plurality of switches comprise:
a first switch on the feed-forward receiver path, selectively coupling to ground or coupling the antenna to the receiver frequency filter;
a second switch on the feed-forward transmitter path, selectively coupling to ground or coupling the transmitter frequency filter to the antenna;
a third switch on the feed-forward receiver path, selectively coupling the receiver frequency filter to the low noise amplifier, and
a fourth switch on the feed-forward transmitter path, selectively coupling to the power amplifier to the transmitter frequency filter.

10. The method of claim 9, wherein one of the different operational modes comprises a frequency swap mode that swap a transmitter frequency response and a receiver frequency response by coupling the first switch and the second switch to ground, while maintaining a connection between the low noise amplifier and the receiver frequency filter via the third switch and maintaining a connection between the power amplifier and the transmitter frequency filter via the fourth switch.

11. The method of claim 9, further comprising opening the first switch, the second switch, the third switch, and the fourth switch to initiate a high isolation mode that disables use of the feed-forward receiver path and the feed-forward transmitter path.

12. A tangible, non-transitory, machine readable medium comprising machine-readable instructions that, when executed by one or more processors of a machine, cause the machine to:
receive communication signals and transmit communication signals in duplex on an antenna of an electrical balance duplexer of transceiver circuitry;
amplify received signals from the antenna using a low noise amplifier;
amplify transmission signals to the antenna using a power amplifier;
isolate the received communication signals from the transmitted communication signals that are received and transmitted in duplex while mitigating insertion loss using the electrical balance duplexer, the electrical balance duplexer comprising a feed-forward receiver path that connects the antenna to the low noise amplifier and a feed-forward transmitter path that connects the power amplifier to the antenna; and
selectively enable one or more of a plurality of switches of the electrical balance duplexer to perform different operational modes of the electrical balance duplexer, wherein the electrical balance duplexer further comprises a receiver frequency filter and a transmitter frequency filter that are selectively coupled using the plurality of switches, wherein the plurality of switches comprise:
a first switch on the feed-forward receiver path, selectively coupling to ground or coupling the antenna to the receiver frequency filter;
a second switch on the feed-forward transmitter path, selectively coupling to ground or coupling the transmitter frequency filter to the antenna;
a third switch on the feed-forward receiver path, selectively coupling the receiver frequency filter to the low noise amplifier; and
a fourth switch on the feed-forward transmitter path, selectively coupling the power amplifier to the transmitter frequency filter.

13. The machine readable medium of claim 12, further comprising machine-readable instructions that, when executed by the one or more processors, cause the machine to: operate the electrical balance duplexer in a moderate mitigation mode that selectively enables use of at least one of the transmitter frequency filter and the receiver frequency filter via the feed-forward transmitter path or the feed-forward receiver path, respectively.

14. The machine readable medium of claim 12, further comprising machine-readable instructions that, when executed by the one or more processors, cause the machine to:
   disconnect the third switch from the receiver frequency filter that connects to the feed-forward receiver path to provide additional isolation to the low noise amplifier; and
   disconnect the fourth switch from the transmitter frequency filter that connects to the feed-forward transmitter path to provide additional isolation to the power amplifier.

* * * * *